United States Patent
Yoshida

(10) Patent No.: US 7,432,128 B2
(45) Date of Patent: Oct. 7, 2008

(54) METHOD OF MAKING SEMICONDUCTOR DEVICE

(75) Inventor: Yuichi Yoshida, Miyazaki (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 12/007,319

(22) Filed: Jan. 9, 2008

(65) Prior Publication Data

US 2008/0138933 A1    Jun. 12, 2008

Related U.S. Application Data

(62) Division of application No. 11/415,067, filed on May 2, 2006, now Pat. No. 7,342,309.

(30) Foreign Application Priority Data

May 6, 2005    (JP)    ............................ 2005-135438

(51) Int. Cl.
*H01L 21/00* (2006.01)
(52) U.S. Cl. ................... 438/106; 438/107; 438/109
(58) Field of Classification Search ................ 438/106, 438/107, 109
See application file for complete search history.

(56) References Cited

U.S. PATENT DOCUMENTS 5,471,369 A    11/1995  Honda et al.
6,407,456 B1    6/2002  Ball
7,009,303 B2    3/2006  Kuroda et al.

FOREIGN PATENT DOCUMENTS

JP    04-116859    4/1992
JP    2000-058743    2/2000

*Primary Examiner*—Roy K Potter
(74) *Attorney, Agent, or Firm*—Rabin & Berdo, PC

(57) ABSTRACT

A method of fabricating a semiconductor device is provided. The semiconductor device has four levels of semiconductor chips stacked on a die pad of a lead frame. Specifically, the first, second, third and fourth semiconductor chips are stacked in turn. The first semiconductor chip shifts from the second semiconductor chip, and the third semiconductor chip shifts from the fourth semiconductor chip. An insulation spacer is placed between the second and third semiconductor chips. The four semiconductor chips are located within the confinement of the die pad. The semiconductor chips, spacer and die pad are sealed in with resin sealing material. Signals are transmitted between the upper semiconductor chip (second semiconductor chip or fourth semiconductor chip) and the lower semiconductor chip (first semiconductor chip or third semiconductor chip) via a plurality of electrode pads connected by wires. Preferably, the first sides, which are the edges of the second and third semiconductor chips, overlap when viewed from the top.

10 Claims, 5 Drawing Sheets

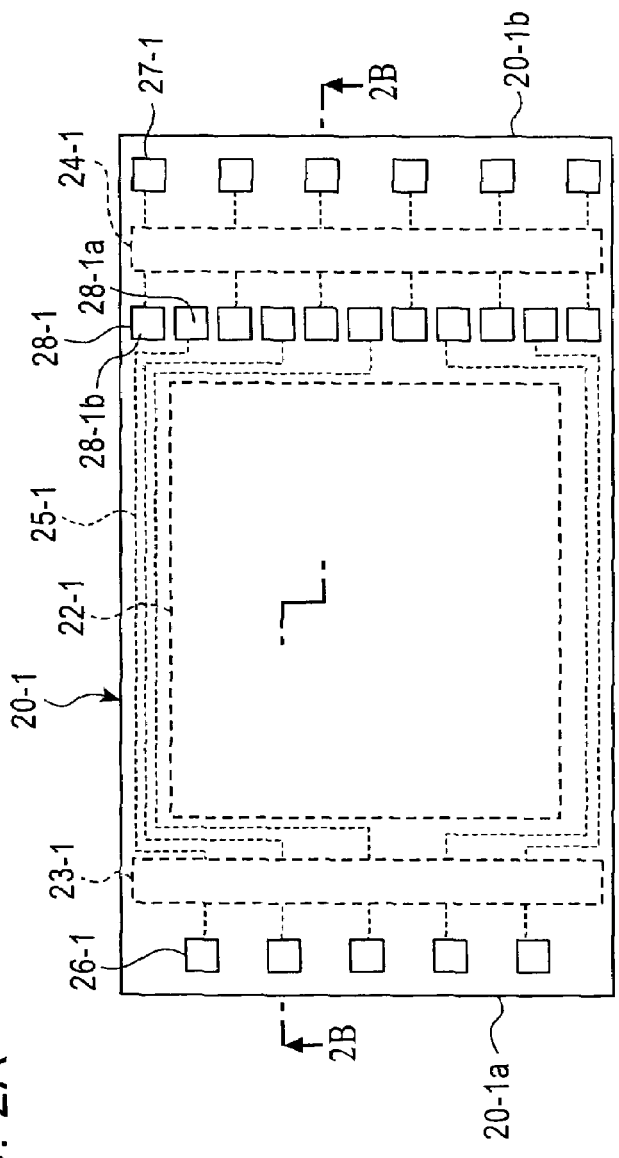
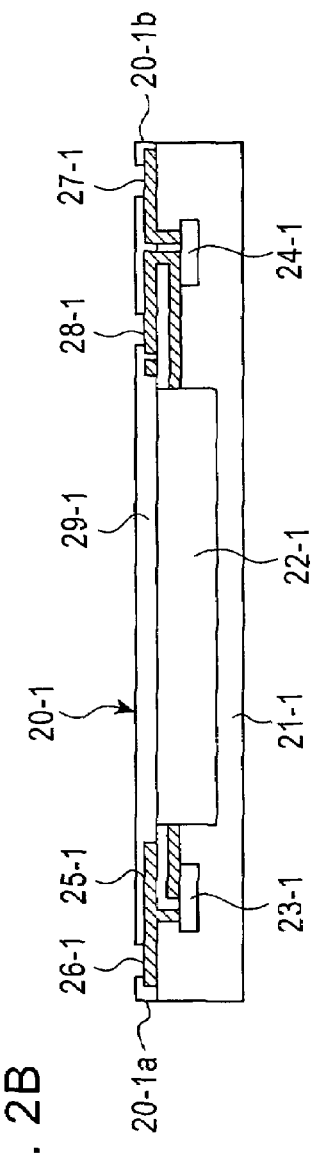
FIG. 2A
FIG. 2B

METHOD OF MAKING SEMICONDUCTOR DEVICE

CROSS-REFERENCE TO RELATED APPLICATION

This application is a divisional application of U.S. patent application Ser. No. 11/415,067 filed on May 2, 2006 now U.S. Pat. No. 7,342,309.

BACKGROUND OF THE INVENTION

1. Field of the Invention

The present invention relates to a method of fabricating a semiconductor device having a plurality of semiconductor chips stacked.

2. Description of the Related Art

In the field of semiconductor devices, such as semiconductor memories, semiconductor chip-stacked (multi-chip package) semiconductor devices, where a plurality of semiconductor chips are stacked, are known, in order to increase the capacity of memory and to increase functions. One example of such semiconductor device is disclosed in Japanese Patent Application Kokai (Laid-Open) No. 4-116859 and another example is disclosed in Japanese Patent Application Kokai No. 2000-58743.

FIG. 2 of Japanese Patent Application Kokai No. 4-116859 shows a semiconductor device having first and second semiconductor chips which serve as semiconductor memories. The first and second semiconductor chips are shifted to each other, and stacked on the die pad of the lead frame. In this semiconductor device, the first semiconductor chip is secured on the die pad, and the second semiconductor chip is secured on the first semiconductor chip at a shifted position so as to avoid the electrode pads formed at the edge of the upper surface of the first semiconductor chip. The electrode pads on the upper surface of the first and second semiconductor chips are connected to the external terminals of the lead frame by wires (fine metal lines), and all of these are sealed in by resin.

FIG. 1 of Japanese Patent Application Kokai No. 2000-58743 shows another type of a semiconductor device having a first and second semiconductor chips. The first and second semiconductor chips have roughly the same dimensions. An insulation spacer is located between the first and second semiconductor chips so that wire bonding (wire connection) to electrode pads on the upper face (front face) of the first semiconductor chip hidden under the second semiconductor chip is realized.

As larger capacities are demanded for semiconductor memories, multi-chip packages are required to implement larger capacities with conventional semiconductor chips. If a very large memory capacity is desired, 3, 4 or even a higher number of semiconductor chips must be stacked.

However, if many semiconductor chips are stacked shifted from each other stepwise, like the case of the semiconductor device disclosed in Japanese Patent Application Kokai No. 4-116859, the width of the package becomes wide.

If many semiconductor chips are stacked inserting the insulation spacer between each two semiconductor chips, like the case of the semiconductor device disclosed in Japanese Patent Application Kokai No. 2000-58743, on the other hand, then the height (thickness) of the package becomes high.

SUMMARY OF THE INVENTION

It is one object of the present invention to provide a method of fabricating a semiconductor device which allows downsizing in the vertical and horizontal dimensions of the semiconductor device, even if the number of stacked semiconductor chips increases.

A semiconductor device includes a first, second, third and fourth semiconductor chips which have the same configuration. Each semiconductor chip has a first side and a second side opposite the first side. Each semiconductor chip has first electrode pads formed along the first side, second electrode pads formed along the second side, and third electrode pads formed along the second electrode pads and electrically connected with the first electrode pads. The first, second and third electrode pads are formed on the upper face of the semiconductor chip. The first semiconductor chip is mounted on a die pad.

The second semiconductor chip is mounted on the first semiconductor chip, such that the first side of the second semiconductor chip protrudes from the first side of the first semiconductor chip, and such that the second and third electrode pads of the first semiconductor chip are exposed. A spacer is mounted on the second semiconductor chip, and a third semiconductor chip is mounted on the spacer such that the first, second and third electrode pads of the second semiconductor chip are exposed. The fourth semiconductor chip is mounted on the third semiconductor chip such that the first side of the fourth semiconductor chip protrudes from the first side of the third semiconductor chip, and such that the second and third electrode pads of the third semiconductor chip are exposed.

The third electrode pads of the first and second semiconductor chips are electrically connected to each other. The third electrode pads of the third and fourth semiconductor chips are electrically connected to each other. The first electrode pads of the second and fourth semiconductor chips are electrically connected to a first external terminal, and the second electrode pads of the first and third semiconductor chips are electrically connected to a second external terminal. The first, second, third and fourth semiconductor chips, the die pad and the spacer are entirely sealed with resin. The first and second external terminals are partly sealed with the resin. The electric connections are made by wires, for example.

Because the spacer is inserted between the second semiconductor chip and the third semiconductor chip, the first electrode pads on the second semiconductor chip can be exposed without shifting the third semiconductor chip. By using both shifting and the spacer, an increase of the area of the semiconductor device can be prevented, and an increase of thickness of the semiconductor device is minimized. Also, electric connections are possible from both the first and second sides of the semiconductor chips.

According to one aspect of the present invention, there is provided a method of fabricating a semiconductor device. The semiconductor device includes first, second, third and fourth semiconductor chips having the same configuration. The semiconductor device also has a die pad, and first and second external terminals. Each semiconductor chip has a first side and an opposite, second side. Each semiconductor device has first electrode pads formed along the first side, second electrode pads formed along the second side, and third electrode pads formed along the second electrode pads and electrically connected with the first electrode pads. The first, second and third electrode pads are formed on the upper face of the semiconductor chip.

The fabrication method includes securing the lower face (back face) of the first semiconductor chip on the die pad, and securing the lower face of the second semiconductor chip on the upper face of the first semiconductor chip such that the first side of the second semiconductor chip protrudes from the first side of the first semiconductor chip, and the second and third electrode pads of the first semiconductor chip are exposed. The fabrication method also includes securing a spacer on the upper face of the second semiconductor chip, such that the first, second and third electrode pads of the second semiconductor chip are exposed, and securing the lower face of the third semiconductor chip on the spacer. The fabrication method also includes securing the lower face of the fourth semiconductor chip on the upper face of the third semiconductor chip such that the first side of the fourth semiconductor chip protrudes from the first side of the third semiconductor chip, and the second and third electrode pads of the third semiconductor chip are exposed.

The fabrication method further includes electrically connecting the third electrode pads of the first and second semiconductor chips to each other, and electrically connecting the third electrode pads of the third and fourth semiconductor chips to each other. The fabrication method also includes electrically connecting the first electrode pads of the second and fourth semiconductor chips to the first external terminal, and electrically connecting the second electrode pads of the first and third semiconductor chips to the second external terminal. The fabrication method also includes entirely sealing the first, second, third and fourth semiconductor chips, the die pad, and the spacer with resin and partly sealing the first and second external terminals with the resin.

Because the spacer is inserted between the second and third semiconductor chips, the first electrode pads on the second semiconductor chip can be exposed without shifting the third semiconductor chip. By using both shifting and the spacer, an increase of the area of the semiconductor device can be prevented, an increase of thickness is minimized, and electrical connection can be made from both the first and second sides of the semiconductor chips.

BRIEF DESCRIPTION OF THE DRAWINGS

FIG. 2A is an enlarged plan view depicting the configuration of a first semiconductor chip in FIG. 1;

FIG. 2B is a cross-sectional view taken along the line 2B-2B in FIG. 2A;

DETAILED DESCRIPTION OF THE INVENTION

Embodiment 1

Figure 1:
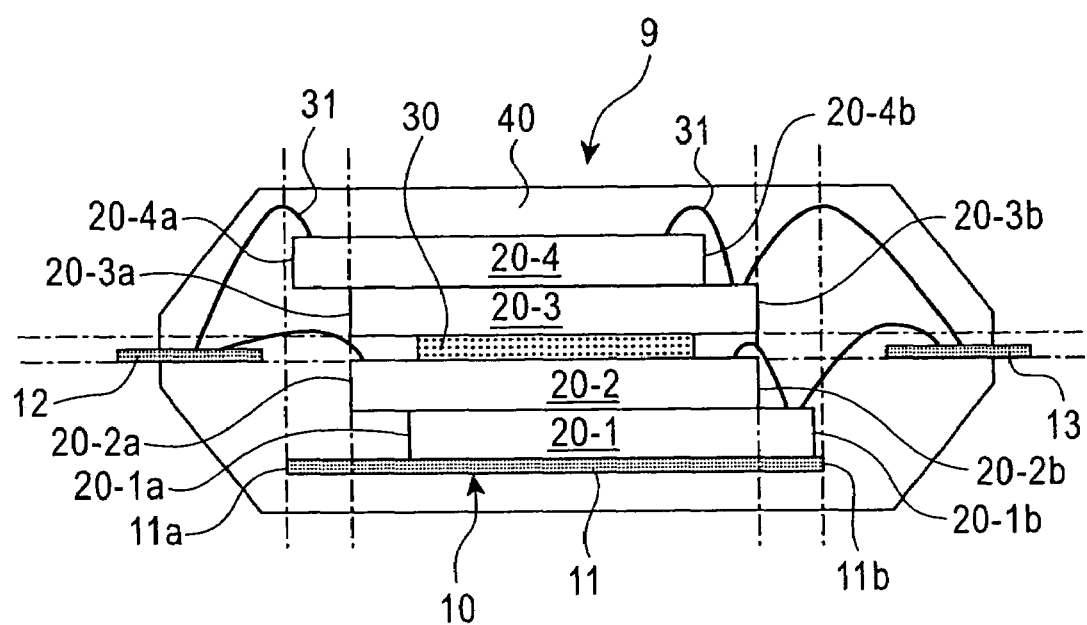
FIG. 1 is a schematic cross-sectional view of a chip-stacked semiconductor device according to Embodiment 1 of the present invention.

Referring to FIG. 1, a semiconductor chip-stacked semiconductor device according to Embodiment 1 of the present invention will be described.

This semiconductor chip-stacked semiconductor device 9 has four semiconductor chips stacked. Specifically, the semiconductor device 9 has four levels of first, second, third and fourth semiconductor chips 20-1 to 20-4. The four semiconductor chips are shifted and stacked on a die pad 11 of a lead frame 10. An insulation spacer 30 is inserted at the center, i.e., between the second and third semiconductor chips 20-2 and 20-3. The semiconductor chips 20-1 to 20-4 are located within the die pad 11. The entire device is sealed in by the resin sealing element 40. The die pad 11 is provided for chip mounting.

The die pad 11 on the lead frame 10 is supported by support pieces (not shown) structured in two levels, for example, from a frame main body (not shown), and has a square shape with a thickness of about 125 to 150 μm. Near the first side (left side) 11a of the die pad 11, a plurality of first external terminals 12, which are supported by the frame main body via supporting members (not illustrated) are disposed. Near the second side 11b opposite the first side 11a, a plurality of second external terminals 13 are disposed. Each external terminal 12 and 13 is a lead piece with a thickness of about 125-150 μm, and inside thereof is an inner lead section, and an outside thereof is the outer lead section. The height of each external terminal 12 and 13 is between the height of the lower face (back face) of the third semiconductor chip 20-3 and the height of the upper face (front face) of the second semiconductor chip 20-2.

Each of the first to fourth semiconductor chips 20-1 to 20-4 mounted on the die pad 11 is an integrated circuit chip, such as a semiconductor memory made of silicon, which has roughly the same dimensions, with a thickness of about 290 μm, and has a square shape of which the area is smaller than the die pad 11. Each semiconductor chip 20-1 to 20-4 has first side (left side) 20-1a to 20-4a and second side (right side) 20-1b and 20-4b. In the upper face of each semiconductor chip 20-1 to 20-4, a plurality of electrode pads, which are external lead electrodes, are buried near the first side 20-1a to 20-4a and the second side (opposite side) 20-1b to 20-4b. These electrode pads are exposed from the openings on the upper face of each semiconductor chip.

The lower face of the first semiconductor chip 20-1 is secured on the die pad 11 by adhesive, and the lower face of the second semiconductor chip 20-2, shifted in the horizontal direction, is secured on the upper face of the first semiconductor chip 20-1 by adhesive. Then the lower face of the third semiconductor chip 20-3 is secured on the upper face of the second semiconductor chip 20-2, via the insulating spacer 30 made of non-conductive silicon, for example. On the upper face of the third semiconductor chip 20-3, the lower face of the fourth semiconductor chip 20-4, shifted in the horizontal direction, is secured by adhesive. The insulating spacer 30 has a thickness of about half of each semiconductor chip 20-1 to 20-4 (150 μm), and has a square shape, for example, of which the area is smaller than each semiconductor chip 20-1 to 20-4.

The stacking status of the die pad, 11, the first and second semiconductor chips 20-1 and 20-2, the spacer 30 and the third and fourth semiconductor chips 20-3 and 20-4 is described below.

The first semiconductor chip 20-1 is secured on the upper face of the die pad 11 such that the first semiconductor chip 20-1 does not extend out of both edges 11a and 11b of the die pad 11, for example. The second semiconductor chip 20-2 is secured on the upper face of the first semiconductor chip 20-1, such that the first side (first edge) 20-2a of the second semiconductor chip 20-2 protrudes from the first side 20-1a of the first semiconductor chip 20-1, and the electrode pads near the second side 20-1b of the first semiconductor chip 20-1 are exposed. The spacer 30 is secured on the upper face of the second semiconductor chip 20-2 by adhesive, such that the electrode pads near both sides 20-2a and 20-2b of the second semiconductor chip 20-2 are exposed. The third semiconductor chip 20-3 is secured on the spacer 30 by adhesive, such that the first side 20-3a of the third semiconductor chip 20-3 overlaps with the first side 20-2a of the second semiconductor chip 20-2 when viewed from the top. The fourth semiconductor chip 20-4 is secured on the upper face of the third semiconductor chip 20-3 such that the first side 20-4a thereof protrudes from the first side 20-3a of the third semiconductor chip 20-3, yet still within the edge 11a of the die pad 11, and the electrode pads near the second side 20-3b of the third semiconductor chip 20-3 are exposed.

For example, the first semiconductor chip 20-1 is connected to the second semiconductor chip 20-2 and the second external terminals 13 by the wires 31, the second semiconductor chip 20-2 is connected to the first external terminals 12 by the wires 31, and the third semiconductor chip 20-3 is connected to the fourth semiconductor chip 20-4 and the second external terminals 13 by the wires 31.

The die pad 11, first to fourth semiconductor chips 20-1 to 20-4, spacer 30, wires 31 and external terminals 12 and 13 are resin-sealed by the resin sealing element 40. The outer lead sections, which are a part of the external terminals 12 and 13, are exposed to lead out the electrodes.

FIG. 2A is an enlarged plan view depicting the configuration of the semiconductor chip (e.g., first semiconductor chip 20-1) in FIG. 1. FIG. 2B is a cross-sectional view sectioned along the line 2B-2B in FIG. 2A.

The first semiconductor chip 20-1 has a square substrate 21-1 made of a silicon semiconductor, and an internal circuit 22-1, which is an integrated circuit, such as a semiconductor memory, formed in this substrate 21-1. The first input/output circuit 23-1 is formed near the first side 20-1a on the substrate 21-1, and the second input/output circuit 24-1 is formed near the second side 20-1b. The input/output circuits 23-1 and 24-1 are circuits for interfacing, such as converting input voltage from the outside (e.g., 5.0V) into an internal voltage (e.g., 3.3V). The inter-connects 25-1 are formed on the internal circuit 22-1 and the input/output circuits 23-1 and 24-1 so that the internal circuit 22-1 and the input/output circuits 23-1 and 24-1 are electrically connected via the inter-connects 25-1.

On the inter-connects 25-1, a plurality of first electrode pads 26-1 for external connection are formed along the first side 20-1a, and a plurality of second electrode pads 27-1 for external connection are formed along the second side 20-1b, and a plurality of third electrode pads 28-1 for inter-semiconductor chip connection are formed between the first electrode pads 26-1 and the second electrode pads 27-2, along a line closer to the second electrode pads 27-1. Each electrode pad 26-1, 27-1 and 28-1 is an enlarged end of the wiring interconnect 25-1. The first electrode pads 26-1 and the second electrode pads 27-1 are pads for inputting/outputting signals from/to the outside, and are connected to a protective element (not shown), formed in each input/output circuit 23-1 and 24-1. Thus, an electrostatic discharge (ESD) protective measure is taken.

The first electrode pads 26-1 are electrically connected to the first input/output circuit 23-1 via the inter-connects 25-1. The first input/output circuit 23-1 is electrically connected to predetermined pads 28-1a of the third electrode pads 28-1 via the wiring 25-1. Other pads 28-1b among the third electrode pads 28-1 are electrically connected to the second input/output circuit 24-1 via the inter-connects 25-1. The second input/output circuit 24-1 is electrically connected to the second electrode pads 27-1 via the inter-connects 25-1. The input signals from the first electrode pads 26-1 are introduced to certain third electrode pads 28-1a via the first input/output circuit 23-1, and the input signals from the second electrode pads 27-1 are introduced to the remaining third electrode pads 28-1b via the second input/output circuit 24-1.

The inter-connects 25-1 are covered with the insulation film 29-1 for protecting the chip. The electrode pads 26-1, 27-1 and 28-1 are exposed from the openings of the insulation film 29-1.

Similar to the semiconductor chip 20-1, each of the second, third and fourth semiconductor chips 20-2 to 20-4 includes the substrate 21-2 to 21-4, internal circuit 22-2 to 22-4, first input/output circuit 23-2 to 23-4, second input/output circuit 24-2 to 24-4, inter-connect 25-2 to 25-4, first electrode pads 26-2 to 26-4, second electrode pads 27-2 to 27-4, third electrode pads 28-2 to 28-4 and insulation film 29-2 to 29-4.

Figure 3:
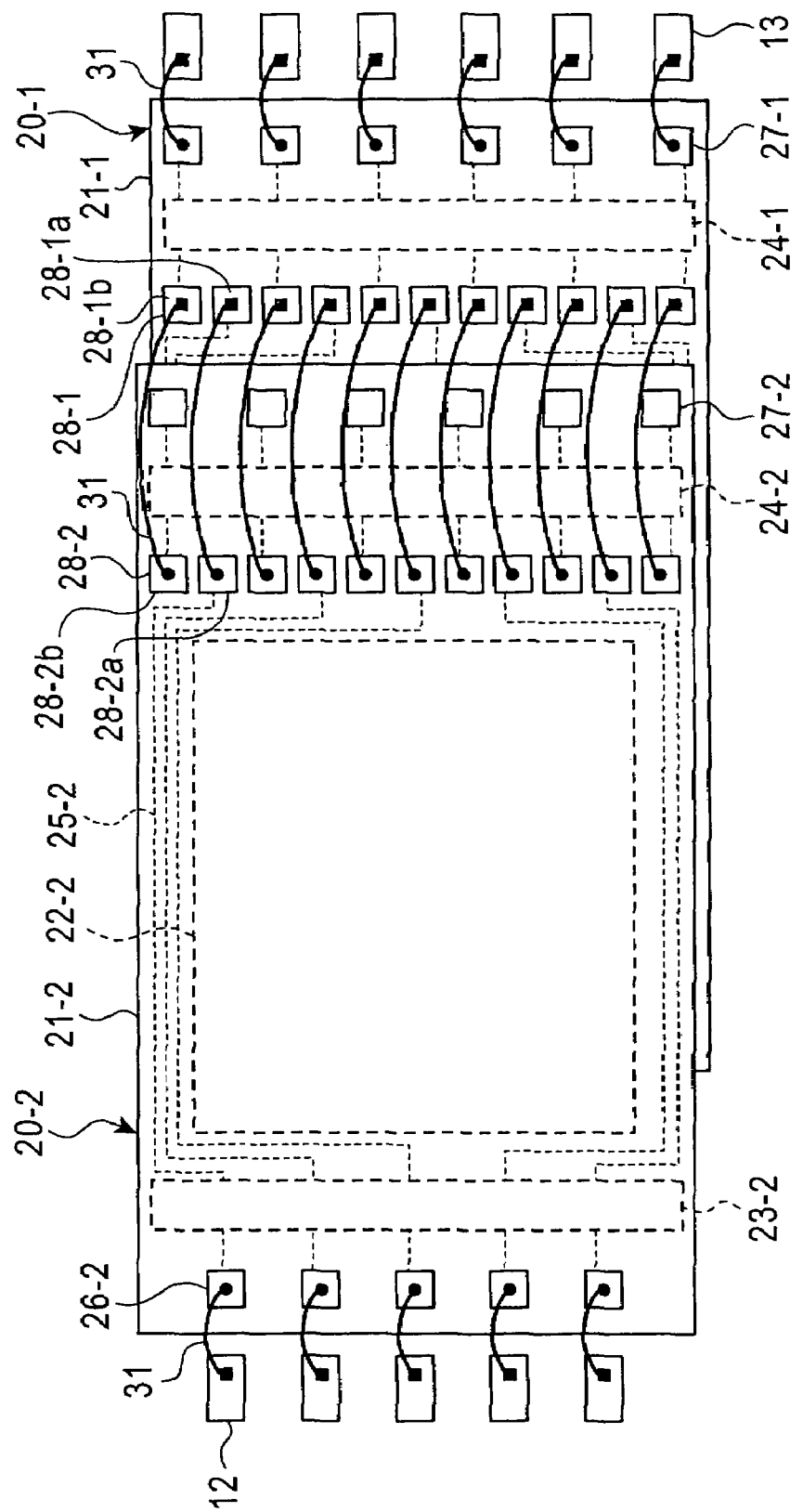
FIG. 3 is an enlarged plan view depicting electric connection between the first and second semiconductor chips shown in FIG. 1.

FIG. 3 is an enlarged plan view depicting the electrical connection between the first and second semiconductor chips 20-1 and 20-2.

A plurality of first electrode pads 26-2 of the second semiconductor chip 20-2 are electrically connected to the first external terminals 12 by the wires 31, and a plurality of third electrode pads 28-2a and 28-2b are electrically connected to a plurality of third electrode pads 28-1a and 28-1b in the underlying first semiconductor chip 20-1 by the wires 31. A plurality of second electrode pads 27-1 are electrically connected to the second external terminals 13 by the wires 31.

Signals are sent between the second semiconductor chip 20-2 and the underlying first semiconductor chip 20-1 via the third electrode pads 28-2 and 28-1. A signal which is supplied from the first external terminal 12 to the first electrode pad 26-2 is sent to the internal circuit 22-1 of the first semiconductor chip 20-1 via the first input/output circuit 23-2 and the third electrode pads 28-2a and 28-1a, and desired electrical processing is performed. A signal which is supplied from the second external terminal 13 to the second electrode pad 27-1 is sent to the internal circuit 22-2 of the second semiconductor chip 20-2 via the second input/output circuit 24-1 and the third electrode pads 28-1b and 28-2b so that certain electrical processing is performed. If a signal is introduced to the internal circuits 22-1 and 22-2 via the third electrodes 28-1 and 28-2, then the signal is directly input, not via the second input/output circuits 24-1 and 24-2. Therefore power consumption in each semiconductor chip 20-1 and 20-2 decreases, compared with the case when a signal is introduced via the input/output circuit 24-1 and 24-2 respectively.

The electrical connection between the third and fourth semiconductor chips 20-3 and 20-4 is not illustrated, but is similar to the electrical connection between the first and second semiconductor chips 20-1 and 20-2. Likewise, the signal flow between the third and fourth semiconductor chips 20-3 and 20-4 is similar to that between the first and second semiconductor chips 20-1 and 20-2.

Now, an exemplary fabrication method for the semiconductor device 9 will be described.

The first, second, third and fourth semiconductor chips 20-1 to 20-4 are prepared, and the lead frame 10 together with the die pad 11 is prepared. The die pad 11 is depressed in two steps.

First, the die bonding step is carried out. In the die bonding step, the lower face of the first semiconductor chip 20-1 is secured on the die pad 11 by adhesive. On the upper face of the first semiconductor chip 20-1, the lower face of the second semiconductor chip 20-2 is secured by adhesive so that the second and third electrode pads 27-1 and 28-1 of the first semiconductor chip 20-1 are exposed, and the first side 20-2a of the second semiconductor chip 20-2 protrudes. On the upper face of the second semiconductor chip 20-2, the spacer 30 is secured by adhesive so that the first, second and third electrode pads 26-2, 27-2 and 28-2 of the second semiconductor chip 20-2 are exposed.

The lower face of the third semiconductor chip 20-3 is secured on the spacer 30 made of non-conductive silicon, for example, by adhesive, so that the first side 20-3a of the third semiconductor chip 20-3 overlaps with the first side 20-2a of the second semiconductor chip 20-2 when viewed from the top. On the upper face of the third semiconductor chip 20-3, the lower face of the fourth semiconductor chip 20-4 is secured by adhesive, so that the second and third electrode pads 27-3 and 28-3 of the third semiconductor chip 20-3 are exposed, and the first side 20-4a of the fourth semiconductor chip 20-4 lies inside the edge 11a of the die pad 11, and protrudes from the first side 20-3a of the third semiconductor chip 20-3.

Then the wire bonding step is carried out. In the wire bonding step, the third electrodes 28-1 of the first semiconductor chip 20-1 and the third electrodes 28-2 of the second semiconductor chip 20-2 are connected to each other by the wiring 31, and the third electrode pads 28-3 of the third semiconductor chip 20-3 and the third electrode pads 28-4 of the fourth semiconductor chip 20-4 are connected to each other by the wiring 31. Then the first electrode pads 26-1 of the second semiconductor chip 20-2 and the first electrode pads 26-4 of the fourth semiconductor chip 20-4 are connected to the inner lead sections of the first external terminals 12 by the wiring 31, and the second electrode pads 27-1 of the first semiconductor chip 20-1 and the second electrode pads 27-3 of the third semiconductor chip 20-3 are connected to the inner lead sections of the second external terminals 13 by the wiring 31.

Next, the resin sealing step is carried out to form the sealing element 40. In the resin sealing step, the lead frame 10 on which the semiconductor chips 20-1 to 20-4 are mounted is set in a die, and melted resin is injected into the die by a transfer molding method so that the die pad 11, semiconductor chips 20-1 to 20-4, spacer 30, wiring 31 and inner lead sections of the external terminals 12 and 13 are sealed with resin, and the outer lead sections of the external terminals 12 and 13 are exposed.

Then the lead frame 10, sealed with the resin sealing 40, is ejected from the die. Excess material, such as flashes of the resin sealing 40 and linked portions of the lead frame 10, is trimmed away. The ends of the exposed outer lead sections in the external terminals 12 and 13 are bent. The resin sealing step is the last step of the fabrication process.

Embodiment 1 has such advantages as the following (1) to (5).

(1) Since the spacer 30 is inserted between the second semiconductor chip 20-2 and the third semiconductor chip 20-3, the first electrode pads 26-1 on the second semiconductor chip 20-2 can be exposed without shifting the third semiconductor chip 20-3 from the second semiconductor chip 20-2. The third semiconductor chip 20-3 completely overlaps the second semiconductor chip 20-2, when viewed from the top. By using both shifting and the spacer 30 in the semiconductor device 9, an increase of the area of the semiconductor device 9 when viewed from the top can be prevented, and an increase of the thickness of the semiconductor device 9 can also be minimized. In addition, the connection becomes possible from both the first side 20-1a to 20-4a and the second side 20-1b to 20-4b of the semiconductor chips 20-1 to 20-4.

(2) Signals are transmitted between the upper semiconductor chip 20-2 (20-4) and the lower semiconductor chip 20-1 (20-3) via the third electrode pads 28-2 and 28-1 (28-4 and 28-3). When signals are introduced to the internal circuits 22-1 and 22-2 (22-3 and 22-4) via the third electrode pads 28-1 and 28-2 (28-3 and 28-4), the signals are directly supplied without via the second input/output circuits 24-1 and 24-2 (24-3 and 24-4). Therefore the power consumption of each semiconductor chip 20-1 to 20-4 decreases compared with the case of introducing signals via the associated input/output circuit 24-1 to 24-4.

(3) If the spacer 30 is made from the same material as the semiconductor chips 20-1 to 20-4, thermal stress after resin sealing becomes uniform, and an improvement in the yield of the semiconductor devices can be expected.

(4) Because the second and third semiconductor chips 20-2 and 20-3 are located such that the first sides 20-2a and 20-3a thereof overlap, the stacking balance of the third semiconductor chip 20-3 can be maintained, and mechanical strength of the semiconductor device 9 can be improved.

(5) Because the first side 11a of the die pad 11 protrudes from the first side 20-4a of the fourth semiconductor chip 20-4, the stress applied to the first side 20-4a of the fourth semiconductor chip 20-4 protruding from the first side 20-3a of the third semiconductor chip 20-3 can be decreased, and mechanical strength of the semiconductor device 9 can be improved.

Embodiment 2

Figure 4:
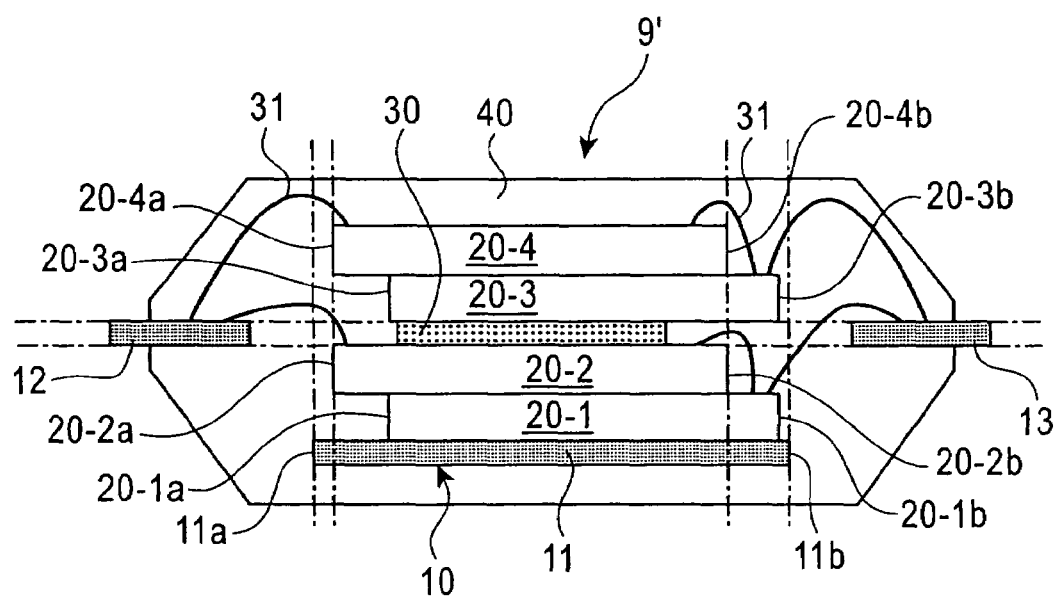
FIG. 4 is a schematic cross-sectional view depicting another chip-stacked semiconductor device according to Embodiment 2 of the present invention.

FIG. 4 is a schematic cross-sectional view depicting another semiconductor chip-stacked semiconductor device 9' according to Embodiment 2 of the present invention. Elements the same as those in Embodiment 1 in FIG. 1 are denoted with the same reference numerals and symbols.

The differences of the semiconductor chip-stacked semiconductor device 9' of Embodiment 2 from the semiconductor device 9 of Embodiment 1 are that the thickness of the spacer 30 is roughly the same as the thickness of the external terminals 12 and 13, the positions of the spacer 30 and the external terminals 12 and 13 are roughly the same, the first side 20-1a of the first semiconductor chip 20-1 and the first side 20-3a of the third semiconductor chip 20-3 overlap when viewed from the top, and the first side 20-2a of the second semiconductor chip 20-2 and the first side 20-4a of the fourth semiconductor chip 20-4 overlap when viewed from the top. Other structures of the semiconductor device and the fabrication method are the same as Embodiment 1.

Embodiment 2 has the same advantages as the advantages (1), (2), (3) and (5) of Embodiment 1, and has additional advantages (6) and (7).

(6) Because the thickness of the spacer 30 is roughly the same as that of the external terminals 12 and 13, and the position of the spacer 30 is roughly the same as those of the external terminals 12 and 13, the semiconductor chips 20-1 to 20-4 are mounted roughly at the center of the semiconductor device 9', and the melted resin during resin sealing can flow uniformly.

(7) Because the first sides 20-1a and 20-3a of the first and third semiconductor chips 20-1 and 20-3 overlap each other, and the first sides 20-2a and 20-4a of the second and fourth semiconductor chips 20-2 and 20-4 overlap each other, the area of the semiconductor device 9' when viewed from the top can be minimized.

Embodiment 3

Figure 5A:
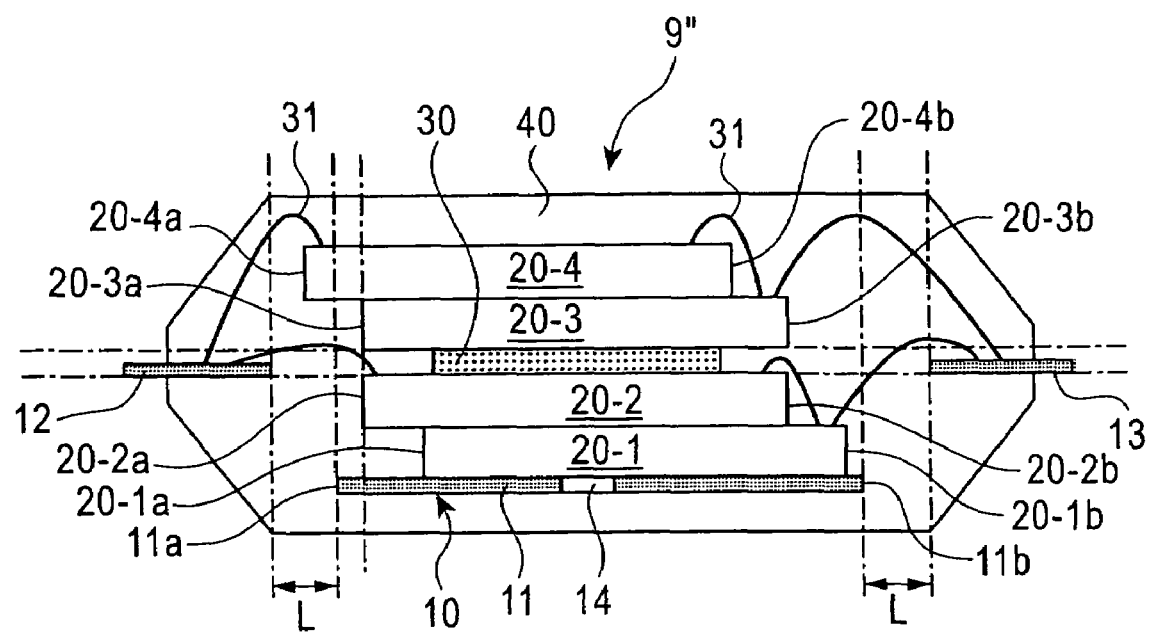
FIG. 5A is a schematic cross-sectional view depicting still another chip-stacked semiconductor device according to Embodiment 3 of the present invention.
Figure 5B:
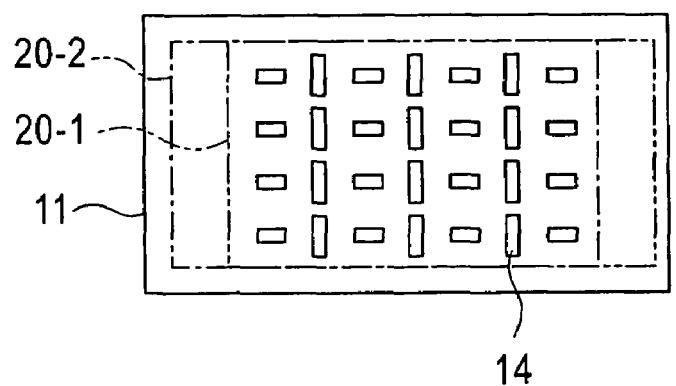
FIG. 5B is a plan view of a die pad of the semiconductor device shown in FIG. 5A.

FIG. 5A and FIG. 5B are diagrams depicting still another semiconductor chip-stacked semiconductor device 9" according to Embodiment 3 of the present invention. FIG. 5A is a cross-sectional view of the semiconductor device 9", and FIG. 5B is a plan view of the die pad 11. Elements the same as those in Embodiment 1 shown in FIG. 1 are denoted with the same reference numerals and symbols.

The differences of the multi-chip-stacked semiconductor device 9" of Embodiment 3 from the semiconductor device 9 of Embodiment 1 are that the die pad 11 is disposed between the position at distance L inward from the first external terminals 12 and the position at the same distance L inward from the second external terminals 13, and that a plurality of slit-shaped through holes 14 are formed in an area of the die pad 11 where the semiconductor chips 20-1, 20-2, spacer 30 and semiconductor chips 20-3, 20-4 overlap. The shape of the through holes 14 is a rectangle, as shown in FIG. 5B, but it can be a square, circle, triangle or star. Other structures of the semiconductor device 9" and fabrication method are the same as Embodiment 1.

In Embodiment 3, the through holes 14 are formed in the particular area of the die pad 11 so that the following advantages are obtained in addition to the advantages of Embodiment 1.

When a semiconductor device is mounted, stress is generated by thermal expansion. As FIG. 5A shows, if the first side 20-4a of the fourth semiconductor chip 20-4 protrudes from the edge 11a of the die pad 11, stress tends to concentrate on this protruding area. However if the through holes 14 are created in the die pad 11, stress concentrates on areas around the through holes 14. The amount of the stress generated in the entire semiconductor device 9" is the same whether the through holes 14 are created in the die pad 11 or not, but if the through holes 14 are created, then the stress generation areas can be concentrated on areas around the through holes 14. Also by creating the through holes 14 on an area where the semiconductor chips 20-1, 20-2, spacer 30, semiconductor chips 20-3, 20-4 are stacked (that is an overlapped area), stress is applied to the semiconductor chips 20-1, 20-2, spacer 30, semiconductor chips 20-3, 20-4. Thus, even if stress concentrates on areas near the through holes 14, the stress applied on each semiconductor chip can be minimized, and the semiconductor chips 20-1, 20-2, spacer 30, semiconductor chips 20-3, 20-4 are protected from cracking. In this way, even if the first side 20-4a of the fourth semiconductor chip 20-4 protrudes from the side 11a of the die pad 11, the concentration of stress on the protruding area can be avoided. Therefore, the first side 20-4a of the fourth semiconductor chip 20-4 would not be damaged. Accordingly, Embodiment 3 has more advantages than Embodiment 1.

It should be noted that similar through holes can be made in the semiconductor device 9' of Embodiment 2. The same functions and advantages as Embodiment 3 can be implemented when the through holes 14 are created in the die pad 11 of Embodiment 2.

In Embodiment 3, the die pad 11 is disposed at the center between the position at the distance L inward from the first external terminals 12 and the position at the distance L inward from the second external terminals 13. Therefore, mechanical strength can be improved by a balanced structure.

The present invention is not limited to the above-described Embodiments 1 to 3, but can be modified in various ways. For example, shapes, dimensions, structures, materials and fabrication methods of the lead frame 10, semiconductor chips 20-1 to 20-4 and spacer 30 can be changed in various ways.

This application is based on Japanese Patent Application No. 2005-135438 filed on May 6, 2005 and the entire disclosure thereof is incorporated herein by reference.

What is claimed is:

1. A method of fabricating a semiconductor device, the semiconductor device including a die pad, a first external terminal, a second external terminal, and first to fourth semiconductor chips having a same structure, each said semiconductor chip having a first electrode pad along a first side on its upper face, a second electrode pad along an opposite second side on the upper face, and a third electrode pad along the second electrode pad on the upper face and electrically connected with the first electrode pad, the method comprising:

securing a lower face of the first semiconductor chip on the die pad;

securing a lower face of the second semiconductor chip on the upper face of the first semiconductor chip, with the first side of the second semiconductor chip protruding from the first side of the second semiconductor chip, and the second and third electrode pads of the first semiconductor chip being exposed;

securing a spacer on the upper face of the second semiconductor chip such that the first, second and third electrode pads of the second semiconductor chip are exposed;

securing a lower face of the third semiconductor chip on the spacer;

securing a lower face of the fourth semiconductor chip on the upper face of the third semiconductor chip, with the first side of the fourth semiconductor chip protruding from the third semiconductor chip, and the second and third electrode pads of the third semiconductor chip being exposed;

electrically connecting the third electrode pads of the first and second semiconductor chips to each other, electrically connecting the third electrode pads of the third and fourth semiconductor chips to each other, electrically connecting the first electrode pads of the second and fourth semiconductor chips to the first external terminal, and electrically connecting the second electrode pads of the first and third semiconductor chips to the second external terminal; and entirely sealing the first, second, third and fourth semiconductor chips, the die pad and the spacer with resin and partly sealing the first and second external terminals with the resin.

2. The fabrication method according to claim 1, wherein an internal circuit, a first input/output circuit, and a second input/output circuit are formed on each of the first, second, third and fourth semiconductor chips, and wherein the first electrode pad has a plurality of first pads connected to the first input/output circuit for inputting/outputting signals from/to an outside, the second electrode pad has a plurality of second pads connected to the second input/output circuit for inputting/outputting signals from/to the outside, the third electrode pad has a plurality of third pads connected to the internal circuit and also to the first electrode pad via the first input/output circuit for transmitting signals with other said semiconductor chips, and the third electrode pad also has a plurality of fourth pads connected to the internal circuit and also to the second electrode pad via the second input/output circuit for transmitting signals with other said semiconductor chips.

3. The fabrication method according to claim 1, wherein the securing of the third semiconductor chip includes securing the third semiconductor chip on the second semiconductor chip so that the first side of the third semiconductor chip overlaps the first side of the first semiconductor chip when viewed from a top.

4. The fabrication method according to claim 1, wherein the securing of the fourth semiconductor chip includes securing the fourth semiconductor chip on the third semiconductor chip so that the first side of the fourth semiconductor chip overlaps the first side of the second semiconductor chip when viewed from the top.

5. The fabrication method according to claim 1, wherein the securing of the third semiconductor chip includes securing the third semiconductor chip on the second semiconductor chip so that the first side of the third semiconductor chip overlaps the first side of the second semiconductor chip when viewed from a top.

6. The fabrication method according to claim 1, wherein the securing of the fourth semiconductor chip includes securing the fourth semiconductor chip on the third semiconductor chip so that an edge of the die pad protrudes from the first side of the fourth semiconductor chip.

7. The fabrication method according to claim 1, wherein the spacer is made of non-conductive silicon.

8. The fabrication method according to claim 1, wherein the thickness of the spacer is substantially the same as a thickness of the first and second external terminals.

9. The fabrication method according to claim 1, wherein a vertical location of the first and second external terminals is between the lower face of the third semiconductor chip and the upper face of the second semiconductor chip.

10. The fabrication method according to claim 1, wherein at least one through hole is formed in the die pad.

* * * * *